(12) United States Patent
Lee et al.

(10) Patent No.: US 9,633,930 B2
(45) Date of Patent: Apr. 25, 2017

(54) METHOD OF FORMING THROUGH-HOLE IN SILICON SUBSTRATE, METHOD OF FORMING ELECTRICAL CONNECTION ELEMENT PENETRATING SILICON SUBSTRATE AND SEMICONDUCTOR DEVICE MANUFACTURED THEREBY

(71) Applicant: Kookmin University Industry Academy Cooperation Foundation, Seongbuk-gu, Seoul (KR)

(72) Inventors: Jaegab Lee, Seoul (KR); Daekyun Jeong, Seoul (KR)

(73) Assignee: Kookmin University Industry Academy Cooperation Foundation, Seoul (KR)

( * ) Notice: Subject to any disclaimer, the term of this patent is extended or adjusted under 35 U.S.C. 154(b) by 0 days.

(21) Appl. No.: 14/952,987

(22) Filed: Nov. 26, 2015

(65) Prior Publication Data

US 2016/0148858 A1 May 26, 2016

(30) Foreign Application Priority Data

Nov. 26, 2014 (KR) .......................... 10-2014-0166288
Oct. 16, 2015 (KR) .......................... 10-2015-0144554
Nov. 25, 2015 (KR) .......................... 10-2015-0165195

(51) Int. Cl.
*H01L 23/48* (2006.01)
*H01L 21/768* (2006.01)

(52) U.S. Cl.
CPC ...... *H01L 23/481* (2013.01); *H01L 21/76831* (2013.01); *H01L 21/76898* (2013.01); *H01L 2924/0002* (2013.01)

(58) Field of Classification Search
CPC ..... H01L 23/48; H01L 24/00; H01L 29/1608; H01L 2224/97
See application file for complete search history.

(56) References Cited

U.S. PATENT DOCUMENTS 6,121,622 A * 9/2000 Beyne .................. G01T 1/2935
250/338.4
6,716,737 B2 * 4/2004 Plas .................. H01L 21/76898
257/E21.597

(Continued)

FOREIGN PATENT DOCUMENTS

KR 1020140108809 9/2014
WO WO 2012129045 A1 * 9/2012 .............. B32B 3/26

*Primary Examiner* — Evren Seven
*Assistant Examiner* — S.M. S Imtiaz
(74) *Attorney, Agent, or Firm* — Masuvalley & Partners

(57) ABSTRACT

The present invention herein relates to a method of forming a through-hole in a silicon substrate. The present invention herein also relates to a method of forming an electrical connection element which penetrates through the silicon substrate, and to a semiconductor device manufactured thereby. More particularly, the present invention herein relates to a method of forming in a silicon substrate a through-hole capable of reducing roughness in a side wall of the through-hole and exhibiting low permittivity, by alternatingly laminating cationic and anionic polymer on the through-hole that has a dent on the side wall to form a porous elastic layer, and also relates to a method of forming an electrical connection that penetrates through the silicon substrate, and to a semiconductor device manufactured thereby.

15 Claims, 17 Drawing Sheets

(56) References Cited

U.S. PATENT DOCUMENTS

| | | | |
|---|---|---|---|
| 7,220,452 B2* | 5/2007 | Hammond Cunningham | B05D 1/283 427/258 |
| 7,556,978 B2* | 7/2009 | Liu | H01H 57/00 257/E27.006 |
| 8,026,592 B2* | 9/2011 | Yoon | H01L 21/76898 257/698 |
| 8,378,462 B2* | 2/2013 | Matsumoto | H01L 21/76898 257/182 |
| 8,786,098 B2* | 7/2014 | Wang | H01L 21/563 257/774 |
| 8,952,542 B2* | 2/2015 | Hua | H01L 21/76898 257/750 |
| 9,024,445 B2* | 5/2015 | Chen | H01L 24/05 257/774 |
| 2005/0153538 A1* | 7/2005 | Tsai | H01L 21/31116 438/636 |
| 2006/0096781 A1* | 5/2006 | Yamano | H01L 21/76898 174/264 |
| 2006/0292877 A1* | 12/2006 | Lake | H01L 21/30655 438/694 |
| 2009/0053139 A1* | 2/2009 | Shi | A61K 31/785 424/9.1 |
| 2011/0169133 A1* | 7/2011 | Arai | H01L 23/147 257/532 |
| 2011/0228065 A1* | 9/2011 | Koyama | A61B 5/0031 348/65 |
| 2011/0253429 A1* | 10/2011 | Humphries | H01L 24/45 174/255 |
| 2011/0284887 A1* | 11/2011 | Wu | H01L 33/62 257/91 |
| 2012/0299222 A1* | 11/2012 | Lan | G03F 7/0002 264/447 |
| 2014/0029162 A1* | 1/2014 | Hur | H01G 11/30 361/502 |
| 2014/0118884 A1* | 5/2014 | Lin | C04B 35/14 361/502 |
| 2015/0071982 A1* | 3/2015 | Lee | A61L 27/34 424/423 |
| 2015/0162264 A1* | 6/2015 | Chang | H01L 23/28 257/415 |
| 2015/0328927 A1* | 11/2015 | Grunlan | B60C 1/00 428/448 |

* cited by examiner

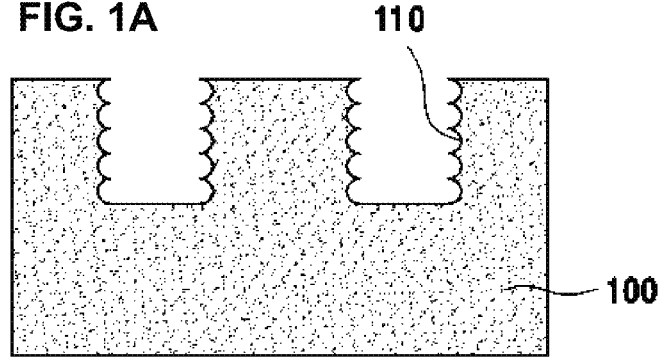
FIG. 1A
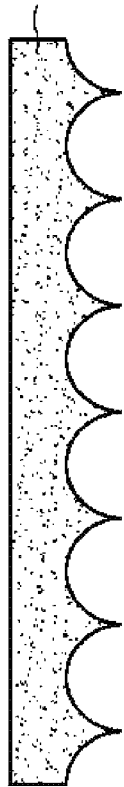
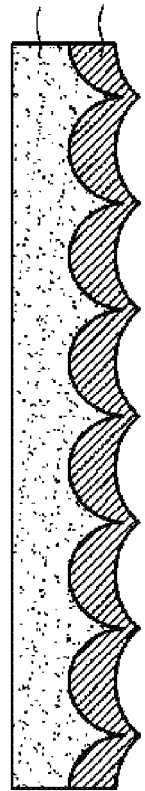
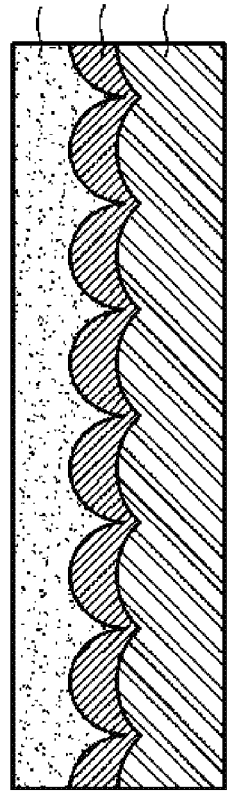
FIG. 1B   FIG. 1C   FIG. 1D

METHOD OF FORMING THROUGH-HOLE IN SILICON SUBSTRATE, METHOD OF FORMING ELECTRICAL CONNECTION ELEMENT PENETRATING SILICON SUBSTRATE AND SEMICONDUCTOR DEVICE MANUFACTURED THEREBY

This application claims priority under 35 U.S.C. §119 from Korean Patent Application No. 10-2014-0166288 filed Nov. 26, 2014; Korean Patent Application No. 10-2015-0144554 filed Oct. 16, 2015 and Korean Patent Application No. 10-2015-0165195 filed Nov. 25, 2015; which are incorporated herein by reference in their entirety.

BACKGROUND OF THE INVENTION

The present invention herein relates to a method of forming a through-hole in a silicon substrate. The present invention herein also relates to a method of forming an electrical connection element which penetrates through the silicon substrate, and to a semiconductor device manufactured thereby. More particularly, the present invention herein relates to a method of forming in a silicon substrate a through-hole capable of reducing roughness in a side wall of the through-hole and exhibiting low permittivity, by alternatingly laminating cationic and anionic polymer on the through-hole that has a dent on the side wall to form a porous elastic layer, and also relates to a method of forming an electrical connection that penetrates through the silicon substrate, and to a semiconductor device manufactured thereby.

The semiconductor integrated circuit manufacturing process is divided into a process for forming devices on a silicon substrate and a process for electrically connecting the devices. Among these processes, the process for electrically connecting the devices is known as an interconnect process or metallization, and as devices become more highly integrated, improving the yield and reliability of the process is critical.

Currently, aluminum is widely used as the metal line material. However, as devices become more highly integrated, the line width decreases while the total length increases, and consequently the signal transfer time delay, which is represented by the resistor-capacitor (RC) time constant, becomes longer. Moreover, as the line width decreases, short circuiting due to electromigration or stress migration becomes a critical limitation. Thus, in order to manufacture fast and reliable devices, there has been much research into using copper, which has a smaller resistivity than aluminum and is strongly resistant to electromigration and stress migration, in ultra large scale integrated circuit devices and as next-generation line material in large-area thin film transistor liquid crystal displays.

However, when copper is used as the line material, there is a disadvantage in that the copper necessitates the use of a diffusion barrier and a junction layer due to limitations of rapid diffusion to a dielectric layer and silicon (Si), and low adhesive strength. As semiconductor device size is reduced to the 22 nm node and below, not only does the thickness of several-nanometer scale diffusion barriers and junction layers become a limitation in pattern filling, expansion of the copper and an adhesion with the lower barrier cause difficulty in later processes.

Regarding this, Korean Patent No. 10-1567888 discloses a semiconductor device method for manufacturing a metal line in a semiconductor device by using an expansion absorbing layer. However, when manufacturing the metal line in the semiconductor device that uses the expansion absorbing layer, the deposition material was regulated in order to achieve a low permittivity, but in such a case there is a disadvantage of being difficult to obtain an ultra low permittivity layer. In order to overcome such a limitation, there is a demand for developing a semiconductor device metal line in which the metal line of the semiconductor device may be manufactured through a simple process, the barrier layer and shock at the copper interconnect may be off set, and an ultra low permittivity property is exhibited.

SUMMARY OF THE INVENTION

The present invention was conceived in order to overcome the above limitations, and an object of the present invention is to provide a method of forming in a silicon substrate a through-hole, capable of exhibiting low permittivity, through repeatedly laminating cationic and anionic polymer on a through-hole that has a dent to form a porous elastic layer, and to provide a method of forming an electrical connection element that penetrates through a silicon substrate and a semiconductor device manufactured thereby.

As such, the present invention provides a method of forming a through-hole in a silicon substrate, the method including forming the through-hole in the substrate; pretreating a side wall of the through-hole such that the side wall is electrically charged; forming a first polymer layer by coating the pretreated side wall with a polymer having charges opposite to those of the substrate; and forming a second polymer layer by coating the first polymer layer with a polymer having the same charges as the substrate, wherein the forming of the first polymer layer and the forming of the second polymer layer are repeatedly performed to form an elastic layer in which a plurality of the first polymer layer and second polymer layer are laminated.

In an exemplary embodiment of the present invention, the side wall of the through-hole may be pretreated by using one kind of method selected from the group consisting of ultraviolet (UV) emission, plasma treatment, catalyst treatment, and self-assembled monolayer treatment.

In an exemplary embodiment of the present invention, the first polymer layer and the second polymer layer may be respectively formed through layer-by-layer (LBL) assembly of a cationic polymer and an anionic polymer.

In an exemplary embodiment of the present invention, the cationic polymer may include one or more selected from the group consisting of poly(allylaminehydrochloride) (PAH), poly(ethyleneimine) (PEI), poly(diallyldimethylammoniumchloride) (PDAC), poly(4-vinylbenzyltrimethylammoniumchloride) (PVTAC), and derivatives thereof.

In an exemplary embodiment of the present invention, the anionic polymer may include one or more selected from the group consisting of poly(styrenesulfonate) (PSS), poly(acrylicacid) (PAA), poly(vinylsulfonicacid) (PVS), sulfonated polystyrene (SPS), and derivatives thereof.

In an exemplary embodiment of the present invention, the cationic polymer may be poly(allylaminehydrochloride) or a derivative thereof.

In an exemplary embodiment of the present invention, the anionic polymer is poly(sodium 4-styrenesulfonate) or a derivative thereof.

In an exemplary embodiment of the present invention, a plurality of micropores may be formed on surfaces and inside of the elastic layer; the average diameter of the micropores may be about 100 pm to about 100 nm; and the total volume of the micropores formed inside of the elastic layer is about 20 to about 80 vol % of the elastic layer.

In an exemplary embodiment of the present invention, the total volume of the micropores formed inside of the elastic layer may be about 20 to about 80 vol % of the elastic layer.

In an exemplary embodiment of the present invention, wherein the concentration of the cationic polymer may be about 0.1 to about 20 mM, and the concentration of the anionic polymer may be about 0.1 to about 20 mM.

In an exemplary embodiment of the present invention, the pH of the cationic polymer may be about 1 to about 8, and the pH of the anionic polymer may be about 8 to about 14.

In an exemplary embodiment of the present invention, the cationic polymer or the anionic polymer may further include an inorganic material, the inorganic material being one or more selected from the group consisting of a nanotube, a nanowire, a colloid, a particle, a thin film, and combinations thereof.

In an exemplary embodiment of the present invention, the thickness of the elastic layer may be about 0.1% to about 10% of the diameter of the through-hole.

In an exemplary embodiment of the present invention, after the forming of the elastic layer, etching the unnecessary elastic layer included in the upper and lower portions of the through-hole by using an anisotropic etching process may be further included, wherein the anisotropic etching process may be performed by using at least one selected from the group consisting of ion etching, reactive ion etching, ashing, inductively coupled plasma etching, and wet etching.

In an exemplary embodiment of the present invention, the step coverage of the elastic layer may be at least about 90%.

The present invention provides a method of forming an electrical connection element which penetrates through a silicon substrate and is electrically connected, the method including forming a through-hole in the substrate; pretreating a side wall of the through-hole such that the side wall is electrically charged; forming a first polymer layer by coating the pretreated side wall with a polymer having charges opposite to those of the substrate; forming a second polymer layer by coating the first polymer layer with a polymer having the same charges as the substrate; forming an elastic layer by repeatedly performing the forming of the first polymer layer and the forming of the second polymer layer; and forming the electrical connection element by filling an electrical conductor into the through-hole of the substrate with the elastic layer formed.

In an exemplary embodiment of the present invention, the electrical conductor may include at least one metal selected from the group consisting of Cu, Al, Li, Ni, Co, Fe, Cr, Zn, B, Ag, Ge, Sn, In, V, Ti, Y, Zr, Nb, Ta, W, La, Ce, Pr, Pd, Nd, and mixtures thereof.

In an exemplary embodiment of the present invention, a plurality of micropores may be formed on surfaces and inside of the elastic layer; the average diameter of the micropores may be about 100 pm to about 100 nm; and the total volume of the micropores formed inside of the elastic layer may be about 20 to about 80 vol % of the elastic layer.

In an exemplary embodiment of the present invention, may be further included after forming of the elastic layer and before the filling of the electrical conductor, forming a protective layer on surfaces of the micropores included on the surfaces and inside of the elastic layer, wherein the protective layer is formed through one process selected from the group consisting of electroplating, electroless plating, chemical vapor deposition, atomic layer deposition, and chemical bath deposition.

In another aspect, the present invention provides a semiconductor device including a pattern in which a through-hole is connected by an electrical connection element, the semiconductor device including a silicon substrate in which the through-hole having a protrusion on a side wall thereof is formed; an elastic layer formed by repeatedly forming first and second polymer layers on the side wall of the through-hole; and an electrical conductor provided in the through-hole of the substrate with the elastic layer formed.

In an exemplary embodiment of the present invention, a plurality of micropores may be formed on surfaces and inside of the elastic layer; the average diameter of the micropores is about 100 pm to about 100 nm; and the total volume of the micropores formed inside of the elastic layer may be about 20 to about 80 vol % of the elastic layer.

In an exemplary embodiment of the present invention may be further included a protective layer formed on surfaces of the micropores included on the surfaces and inside of the elastic layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 1A to 1D are diagrams illustrating a method of forming a barrier layer in a semiconductor device, in an embodiment of the present invention;

DETAILED DESCRIPTION OF PREFERRED EMBODIMENTS

Figure 2A:
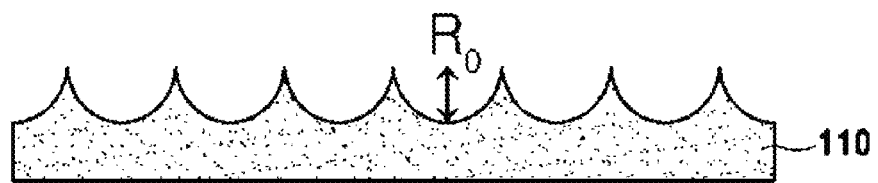
FIGS. 2A and 2B are cross-sectional views of a side wall of a pattern that includes a protrusion, and the side wall after forming the elastic layer, respectively, according to an embodiment of the present invention.

Preferred embodiments of the present invention will be described below in more detail with reference to the accompanying drawings to fully convey the scope of the present invention to those skilled in the art. The present invention may, however, be embodied in different forms and should not be constructed as limited to the embodiments set forth herein. In the drawings, parts unrelated to the description are excluded for clarity of illustration, and like reference numerals refer to like elements throughout.

Throughout the present specification, it will be understood that when a part is referred to as being 'connected' to another part, it can be 'directly connected' or 'electrically connected' to the other part via another intervening device.

Throughout the present specification, it will be understood that when a member is referred to as being 'on' another member, it can be directly on the other member or intervening members may also be present.

Throughout the present specification, it will be understood that when a part is referred to as 'comprising' another element, it may comprise other elements as well if there is no specific limitation. Throughout the present specification, it will be understood that the use of terms such as 'about' or 'substantially' to describe elements in the specification indicate approximate values accounting for manufacturing or material tolerances, and are used for preventing unscrupulous infringement or use of parts of the specification which refer to exact or absolute values. Terms such as 'operation for' or 'operation of' do not indicate intent.

Throughout the present specification, the use of terms such as 'combinations thereof' with Markush-type formats indicate mixtures or combinations of at least one selected from a group consisting of elements disclosed in the Markush-type format.

Throughout the present specification, the use of the format 'A and/or B' indicates 'A or B, or A and B'.

Hereinafter, it will be described about an exemplary embodiment of the present invention in conjunction with the accompanying drawings.

The present invention provides a method of forming a through-hole in a silicon substrate, the method including forming the through-hole in the substrate; pretreating a side wall of the through-hole such that the side wall is electrically charged; forming a first polymer layer by coating the pretreated side wall with a polymer having charges opposite to those of the substrate; and forming a second polymer layer by coating the first polymer layer with a polymer having the same charges as the substrate, in which the forming of the first polymer layer and the forming of the second polymer layer are repeatedly performed to form an elastic layer in which a plurality of the first polymer layer and second polymer layer are laminated.

In an exemplary embodiment of the present invention, the first operation is the operation for forming the through-hole in the substrate 100, and the substrate 100 may be selected from the group consisting of a silicon wafer, a glass, a sapphire, a polymer, a ceramic, and combinations thereof, but is not limited thereto. Desirably, the substrate may be the silicon wafer made of silicon.

Here, the substrate 100 is prepared by being cleaned according to a typical method. By cleaning the substrate 100, contaminants on the silicon substrate 100 may be removed. In the case where contaminants exist on the substrate 100, when forming an the elastic layer 200, a limitation may occur in which the elastic layer 200 cannot be uniformly formed. Cleaning of the substrate 100 may be a removal of the contaminants that exist on the substrate through a process of dipping the substrate 100 in a cleaning solution for a certain amount of time and then rinsing. For example, a piranha solution may be used as the cleaning solution, and the piranha solution may be prepared by mixing sulfuric acid ($H_2SO_4$) and hydrogen peroxide ($H_2O_2$) at a ratio of about 4:1, but may not be limited thereto. The substrate 100 may be rinsed with deionized water to prevent recontamination of the substrate in the rinsing operation, but may not be limited thereto.

In an exemplary embodiment of the present invention, the through-hole may include at least one type selected from the group consisting of a via hole, a trench width, and a through-silicon via (TSV), but may not be limited thereto.

For example, the several nanometer to several hundred nanometer-sized via hole or the several nanometer to several hundred nanometer-sized trench width may have a size on the level of about 1 nm to about 999 nm, about 10 nm to about 999 nm, about 100 nm to about 999 nm, about 300 nm to about 999 nm, about 500 nm to about 999 nm, about 700 nm to about 999 nm, about 900 nm to about 999 nm, about 1 nm to about 900 nm, about 1 nm to about 700 nm, about 1 nm to about 500 nm, about 1 nm to about 300 nm, about 1 nm to about 100 nm, or about 1 nm to about 10 nm, but may not be limited thereto. Moreover, the several hundred nanometer-sized to several hundred micrometer-sized TSV hole may have a size on the level of about 100 nm to about 999 μm, about 300 nm to about 999 μm, about 500 nm to about 999 μm, about 700 nm to about 999 μm, about 900 nm to about 999 μm, about 1 μm to about 999 μm, about 100 μm to about 999 μm, about 300 μm to about 999 μm, about 500 μm to about 999 μm, about 700 μm to about 999 μm, about 900 μm to about 999 μm, about 1 nm to about 900 μm, about 1 nm to about 700 μm, about 1 nm to about 500 μm, about 1 nm to about 300 μm, about 1 nm to about 100 μm, about 1 nm to about 1 μm, about 1 nm to about 900 nm, about 1 nm to about 700 nm, about 1 nm to about 500 nm, about 1 nm to about 300 nm, about 1 nm to about 100 nm, or about 1 nm to about 10 nm, but may not be limited thereto.

According to an exemplary embodiment of the present invention, the through-hole may be formed through one kind of method selected from the group consisting of deep reactive ion etching (DRIE), inductively coupled plasma etching, and ion beam etching, and desirably, the substrate 100 in which the through-hole is formed through a bosch process by using DRIE may be formed, but is not limited thereto. More specifically, the bosch process that uses the DRIE may, after first using a mask on a substrate surface to form the through-hole, selectively etch parts that were not exposed to the mask, and then use C4F8, etc. to form a coating layer on the substrate surface. The above processes of etching, and forming the coating layer may be repeated to thereby etch and thus form the though-hole in a downward direction of the substrate. Here, the width of the through-hole may be maintained, but is not limited thereto. The pattern formed on the substrate 100 through DRIE may include a scallop or the dent, as illustrated in FIG. 1A.

Next, the present invention includes negatively charging the side wall of the through-hole. The operation is a pretreatment operation for forming the elastic layer on the surface of the substrate 100 in which the side wall of the through-hole has the dent, and FIGS. 1B to 1D are related cross-sectional views illustrating in greater detail the through-hole side wall 110 that has the dent according to an embodiment of the present invention.

As is illustrated in FIG. 1C, the elastic layer 200 is formed on the through-hole side wall 110, such as illustrated in FIG. 1B, that has the dent.

In an embodiment of the present invention, the flexible elastic layer 200 may be formed on the through-hole side wall to thereby fill in the dent in the pattern side wall 110 so that the roughness of the side wall is reduced, but may not be limited thereto.

For example, when an inorganic barrier layer such as a thin film is formed as barrier layer on the through-hole side wall of the substrate 100, the inorganic barrier layer, like the pattern side wall 100 that includes a protrusion, also exhibits a rough morphology that includes a sharp edge. Therefore, in a later heat treatment process, cracks may occur when an expansion of metal that is filled inside causes stress to be concentrated in the sharp edge of the bearing layer.

However, as is illustrated in FIG. 1C, when the surface roughness (morphology) of the through-hole side wall 110 that has the dent is improved through the formation of the elastic layer, the portion receiving stress is relieved and thus cracking of the substrate may be prevented. Moreover, the elastic layer 200 may also be formed in order to strengthen the later adhesion between the substrate and an electrical conductor layer 400, and to allow the electrical conduction layer 400 to be easily adsorbed to the substrate 100.

In an embodiment of the present invention, the through-hole side wall of the substrate may be pretreated such that the side wall is charged, in order to improve the later adhesion between the substrate 100 in which the cleaned pattern is formed and the elastic layer 200.

For example, the pretreatment may include ultraviolet (UV) emission, plasma treatment, catalyst treatment, or self-assembled monolayer treatment, but may not be limited thereto. For example, when emitting UV radiation to the substrate 100, the UV radiation having a wavelength of about 53.7 nm to about 184.9 nm may be emitted for about 30 minutes to break down residual organic material on the surface of the substrate 100 and form OH— radicals on the surface of the substrate 100 such that the surface of the substrate becomes hydrophilic, but may not be limited thereto. Moreover, when using the self-assembled monolayer treatment, the radicals that are aligned on the surface of the substrate according to the head group of the monolayer may be negatively or positively charged, but are not limited thereto.

According to an embodiment of the present invention, the elastic layer 200 may be formed on the substrate through layer by layer (LBL) assembly, but may not be limited thereto. For example, the elastic layer 200 may be formed through lamination of elastic material, and lamination may desirably be performed through spin coating, dip coating, roll-to-roll coating, or flow coating, but may not be limited thereto. The elastic layer 200 may be formed as one or more layers, but may not be limited thereto.

In an embodiment of the present invention, the present invention includes forming a first polymer layer by coating the pretreated side wall with a polymer having charges opposite to those of the substrate. By forming the first polymer layer by coating the polymer having charges opposite to those of the substrate on the pretreated side wall and then forming a second polymer layer by coating the first polymer layer with a polymer having the same charges as the substrate, and then repeatedly performing the forming of the first polymer layer and the forming of the second polymer layer, the elastic layer 200 in which a plurality of the first polymer layer and second polymer layer are laminated may be formed.

Figure 2B:
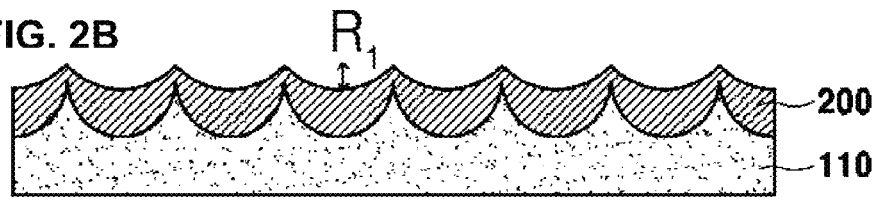

FIGS. 2A and 2B show cross-sectional views of the through-hole side wall 110 of the silicon substrate, and the through-hole side wall 110 of the silicon substrate after forming the elastic layer 200, respectively, according to an embodiment of the present invention. In an embodiment of the present invention, the roughness of the pattern side wall 100 with the protrusion that includes the dent of $R_0$ may be formed to be several nanometer to several micrometer-sized according to a shape of the pattern or a spacing of the scallop. As is illustrated in FIG. 2A, when the elastic layer 200 is formed on the through-hole side wall 110 with the protrusion that includes a step height of $R_0$, the step height of the dent in the through-hole side wall 110 decreases to $R_1$. This is because when forming the elastic layer 200, the elastic layer is first formed on the surface of the through-hole side wall 110 that has the dent protrusion. For example, the $R_1$ may be formed to be a height that is at most about 95% of $R_0$, but may not be limited thereto. For example, when the $R_1$ is formed to be the height that is at most about 1% of $R_0$, the elastic layer may be formed to be flat, and for example, when the $R_1$ is formed to be the height that is about 95% of $R_0$, the thickness of the elastic layer becomes thinner and the roughness of a sharp edge of the scallop is capable of being reduced, and thus an effect of reducing the overall stress may be realized.

Here, the elastic layer 200 may be formed by alternatingly laminating elastic materials exhibiting at least two different kinds of surface charges, and lamination bonding is possible by using a bonding property between at least two different kinds of elastic materials having different densities, pH, surface charge properties, etc.

In an embodiment of the present invention, the elastic materials of differing properties may be laminated to control the low permittivity properties of the elastic layer 200. For example, in forming the first polymer layer 210 and second polymer layer 220 on the substrate 100, the first polymer layer and the second polymer layer may be formed through layer by layer (LBL) assembly of a cationic polymer and an anionic polymer, respectively, but may not be limited thereto. Such may be performed through spin coating, dip coating, roll-to-roll coating, or flow coating, but may not be limited thereto. For example, the first polymer layer 210 and the second polymer layer 220 may have differing surface charges, pH, or density, but may not be limited thereto.

Here, the cationic polymer may be one or more selected from the group consisting of poly(allylaminehydrochloride) (PAH), poly(ethyleneimine) (PEI), poly(diallyldimethylammoniumchloride) (PDAC), poly(4-vinylbenzyltrimethylammoniumchloride) (PVTAC), and derivatives thereof, and may desirably be poly(allylaminehydrochloride) or a derivative thereof.

The anionic polymer may be one or more selected from the group consisting of poly(styrenesulfonate) (PSS), poly(acrylicacid) (PAA), poly(vinylsulfonicacid) (PVS), sulfonated polystyrene (SPS), and derivatives thereof, and may desirably be poly(sodium 4-styrenesulfonate) or a derivative thereof.

Figure 6:
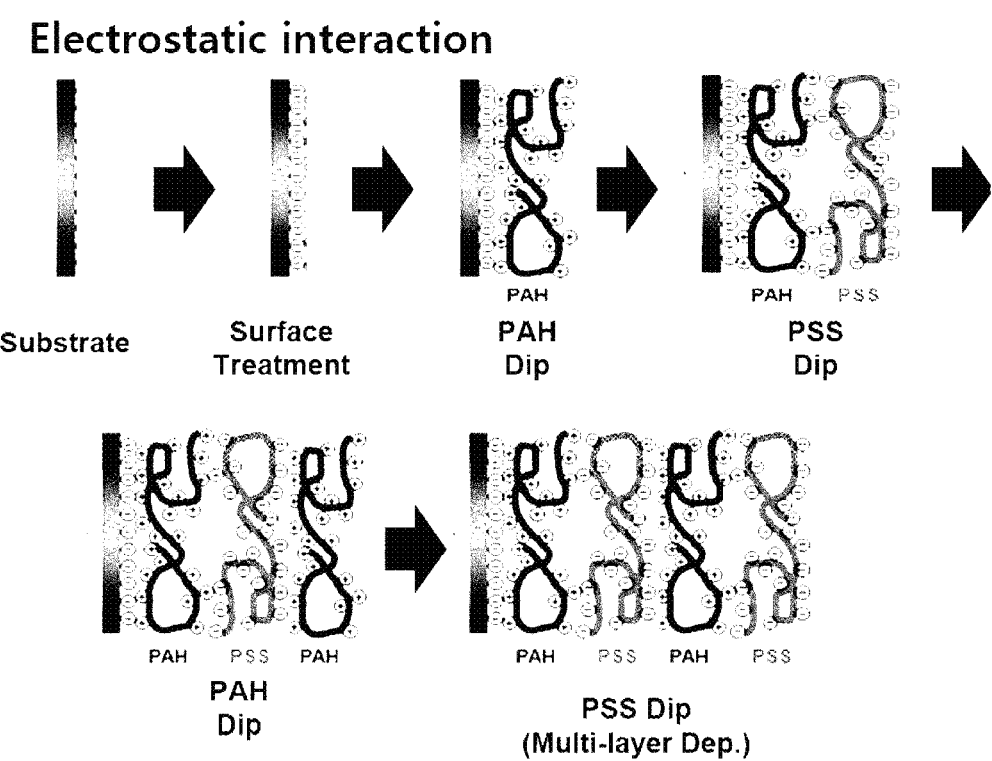
FIG. 6 is a schematic diagram illustrating a structure of an elastic layer according to an embodiment of the present invention.

The elastic layer may be formed by alternatingly laminating the first polymer layer 210 and the second polymer layer 220 at least about one time, and desirably, at least about three times, more desirably at least about five times, more desirably at least about 10 times, more desirably at least about 20 times, and more desirably at least about 40 times (see FIG. 6). The elastic layer may include the first polymer layer having charges opposite to those of the substrate 100 and the second polymer layer having the same charges as the substrate, laminated in sequence, but is not limited thereto.

Here, the elastic layer 200 may include a plurality of micropores on surfaces and inside of the elastic layer. Such may be the micropores formed on surfaces and inside of the elastic layer 200 by a reaction between the cationic polymer and the anionic polymer, but may not be limited thereto. For example, when the first polymer layer is acidic and the second polymer layer exhibits basicity, the elastic layer 200 may be formed by the reaction between the cationic polymer and the anionic polymer, and micropores may be formed inside of the elastic layer 200 by a neutralization reaction, but may not be limited thereto.

In an embodiment of the present invention, the pH of the first polymer 210 may be about 1 to about 8, and the pH of the second polymer 220 may be about 8 to about 14, but is not limited thereto. In an embodiment of the present invention, the greater the difference is between the pH of the first polymer 210 and the second polymer 220, the larger the size may be of the micropores formed inside of the elastic layer 200, and the thicker the thickness may be of the elastic layer 200. Conversely, the smaller the difference is between the pH of the first polymer 210 and the second polymer 220, the smaller the size may be of the micropores formed inside of the elastic layer 200, and the thinner the thickness may be of the elastic layer 200.

In an embodiment of the present invention, the concentration of the first polymer 210 may be about 0.1 to about 20 mM and the concentration of the second polymer 220 may be about 0.1 to about 20 mM, but is not limited thereto. Desirably, the concentration of the first polymer 210 may be about 0.1 to about 10 mM and the concentration of the second polymer 220 may be about 0.1 to about 10 mM, and more desirably, the concentration of the first polymer 210 may be about 0.1 to about 5 mM and the concentration of the second polymer 220 may be about 0.1 to about 5 mM. When the concentration of the first polymer and second polymer is below about 0.1 mM. the growth rate of the LBL layer is low and thus there is a limitation of growth being difficult, and when over about 20 mM, the roughness of the LBL layer increases and thus there is a limitation of being unable to form the film to a uniform thickness.

The cationic polymer or anionic polymer may further include inorganic material, and more specifically, the low permittivity property of the elastic layer 200 may be controlled by using the porous inorganic material by mixing with the cationic polymer or anionic polymer, but may not be limited thereto.

Here, the inorganic material may have the low permittivity property by using the porous inorganic material, but may not be limited thereto. For example, the inorganic material may include the porous material or a material in which the inside is empty, and the inorganic material may include at least one form selected from the group consisting of a nanotube, a nanowire, a colloid, a particle, a thin film, and combinations thereof, but may not be limited thereto.

In an embodiment of the present invention, the conditions for forming the elastic layer may be controlled such that the elastic layer is formed at the condition in which the cationic polymer and the anionic polymer are aggregated with each other. For example, when forming the elastic layer on the surface of the substrate in which the through-hole is formed, at the sharp edge of the dent in the through-hole side wall, elastic material such as the cationic polymer or the anionic polymer are widely spread and thus the formation of the elastic layer is difficult, but at an inner valley of the dent, the tendency of the elastic material to aggregate becomes stronger, and thus the elastic layer may be formed at the inner lower portion of the pattern.

In an embodiment of the present invention, the elastic layer may be formed by repeatedly performing the layer by layer assembly at least about one time, and may desirably be performed at least about three times, at least about five times, at least about 10 times, or at least about 20 times, and more desirably may be performed at least about 40 times. The thickness of the elastic layer may be about 0.1% to about 10% of the through-hole diameter, desirably about 0.1% to about 5%, and more desirably about 0.1% to about 5%.

Meanwhile, after forming the elastic layer, etching the unnecessary elastic layer included in the upper and lower portions of the through-hole by using an anisotropic etching process may be further included, and the anisotropic etching process may be performed by using at least one selected from the group consisting of ion etching, reactive ion etching, ashing, inductively coupled plasma etching, and wet etching. For example, when performing the anisotropic etch by using the ion etching process, plasma is generated in a chamber by separation of gas (Ar) that is injected into the chamber. Here, when the substrate on which the elastic layer according to an embodiment of the present invention is formed is placed in the chamber, and a negative charge is applied to a lower portion of the chamber, the gas (Ar) injected in the chamber moves in a straight line and removes the exposed portions of the elastic layer on the surface and lower portion of the substrate in which the elastic layer is formed. Thereby, the unnecessary elastic layer in the upper and lower portions of the through-hole may be etched through the anisotropic etch.

According to an embodiment of the present invention, the step coverage of the elastic layer may be at least about 90%, but is not limited thereto. The step coverage indicates the horizontal to vertical thickness ratio when forming a thin film, and the step coverage of the elastic layer may be at least about 90%, at least about 92%, at least about 94%, at least about 96% or at least about 98%, but is not limited thereto.

In an embodiment of the present invention, the elastic layer 200 may be porous, but is not limited thereto. By using the porous elastic layer 200, the elasticity of the elastic layer of the through-hole side wall increases, and may exhibit a low permittivity.

Here, the size of the micropores included in the elastic layer 200 may be about 100 pm (picometers) to about 100 nm, and desirably, the size of the micropores included in the elastic layer may be about 100 pm to about 100 nm, about 100 pm to about 50 nm, about 100 pm to about 10 nm, about 100 pm to about 1 nm, about 1 nm to about 100 nm, about 10 nm to about 100 nm, about 30 nm to about 100 nm, about 50 nm to about 100 nm, about 70 nm to about 100 nm, about 90 nm to about 100 nm, about 1 nm to about 90 nm, about 1 nm to about 70 nm, about 1 nm to about 50 nm, about 1 nm to about 30 nm, or about 1 nm to about 10 nm, but is not limited thereto. Due to the micropores included in the elastic layer 200, the elastic layer may exhibit the low permittivity or ultra low permittivity properties.

In an embodiment of the present invention, the total volume of the micropores formed inside of the elastic layer 200 may be about 20 to about 80 vol % of the elastic layer, but is not limited thereto. For example, the total volume of the micropores formed inside of the elastic layer 200 may be about 20 vol % to about 80 vol % of the elastic layer, about 30 vol % to about 80 vol % of the elastic layer, about 40 vol % to about 80 vol % of the elastic layer, about 50 vol % to about 80 vol % of the elastic layer, about 60 vol % to about 80 vol % of the elastic layer, about 70 vol % to about 80 vol % of the elastic layer, about 20 vol % to about 70 vol % of the elastic layer, about 20 vol % to about 60 vol % of the elastic layer, about 20 vol % to about 50 vol % of the elastic layer, about 20 vol % to about 40 vol % of the elastic layer, or about 20 vol % to about 30 vol % of the elastic layer, but is not limited thereto. In an embodiment of the present invention, the greater the volume ratio is of the micropores in the elastic layer 200, the lower may be the dielectric constant of the semiconductor device.

Figure 3:
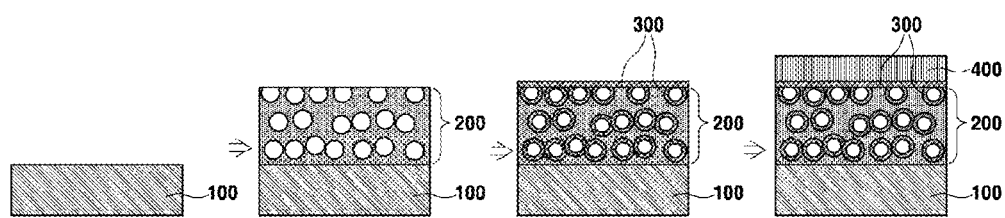
FIG. 3 is a schematic diagram illustrating a method of forming a semiconductor device according to an embodiment of the present invention.
Figure 4:
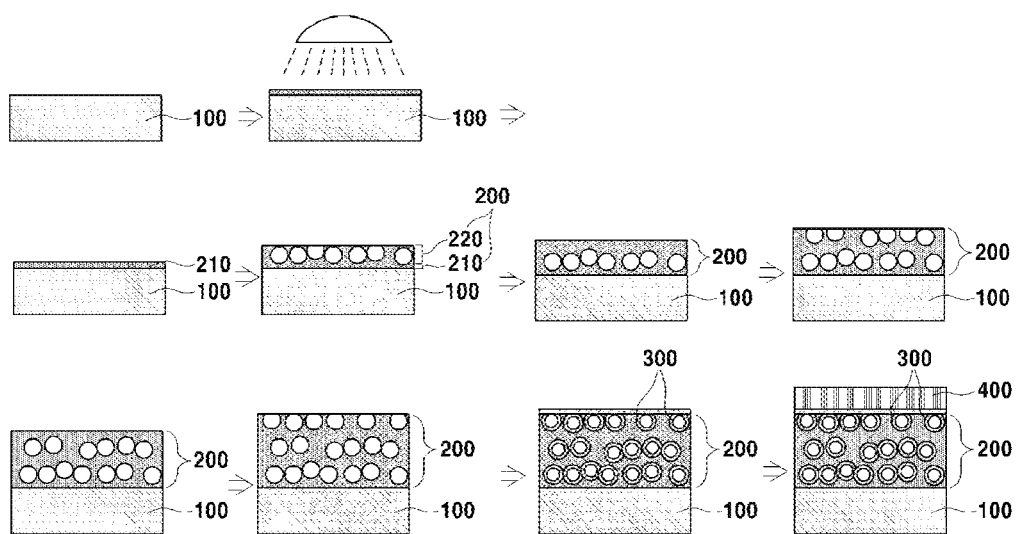
FIG. 4 is a schematic diagram illustrating a method of forming a semiconductor device according to an embodiment of the present invention.
Figure 5:
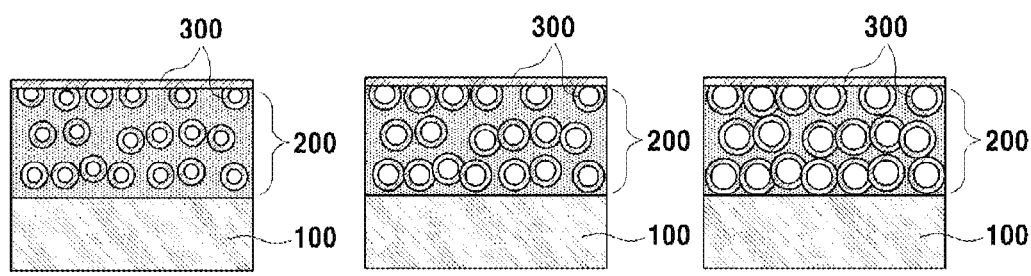
FIG. 5 is a schematic diagram illustrating properties according to the size of micropores inside of an elastic layer according to an embodiment of the present invention.

With regard to this, FIG. 3 is a schematic diagram illustrating properties according to the size of micropores inside of the elastic layer. As illustrated in FIG. 3, when the volume ratio of micropores having a low permittivity, like air, formed inside of the elastic layer 200 increases, the total volume and density of the elastic layer decreases, and accordingly, the permittivity of the elastic layer may decrease.

Moreover, the present invention provides a method of forming an electrical connection element which penetrates through a silicon substrate and is electrically connected, the method including forming a through-hole in the substrate, pretreating a side wall of the through-hole such that the side wall is electrically charged, forming a first polymer layer by coating the pretreated side wall with a polymer having charge opposite to those of the substrate, forming a second polymer layer by coating the first polymer layer with a polymer having the same charges as the substrate, forming an elastic layer by repeatedly performing the forming of the first polymer layer and the forming of the second polymer layer, and forming the electrical connection element by filling an electrical conductor into the through-hole of the substrate with the elastic layer formed. Hereinafter, the present invention is described in greater detail.

In the method of forming the electrical connection element which penetrates through the silicon substrate, forming the through-hole in the substrate, pretreating the side wall of the through-hole such that the side wall is electrically charged, forming the first polymer layer by coating the pretreated side wall with the polymer having charge opposite to those of the substrate, forming the second polymer layer by coating the first polymer layer with the polymer having the same charges as the substrate, forming the elastic layer by repeatedly performing the forming of the first polymer layer and the forming of the second polymer layer may be performed the same as in the above method of forming the through-hole in the silicon substrate, and thus description thereof will not be given.

The present invention includes forming the electrical connection element by filling the electrical conductor into the through-hole of the substrate with the elastic layer formed, as illustrated in FIG. 1D.

In an embodiment of the present invention, forming a protective layer 300 for preventing diffusion of metal that may occur in the heat treatment of the electrical conductor layer 400 may be further included, but is not limited thereto. For example, the protective layer may include a metal thin film, a metal nitride film, or a metal oxide film, and the protective layer may include, for example, Ti, Ta, Ru, W, Zr, Hf, Mo, Nb, V, Cr, Mn, Al, nitride films thereof, or oxide films thereof, but may not be limited thereto.

In an embodiment of the present invention, filling the electrical conductor layer 400 into the through-hole may be performed through electroplating, electroless plating, chemical vapor deposition, atomic layer deposition, or chemical bath deposition, but may not be limited thereto.

According to an embodiment of the present invention, the electrical conduction layer 400 may include at least one selected from the group consisting of Cu, Al, Li, Ni, Co, Fe, Cr, Zn, B, Ag, Ge, Sn, In, V, Ti, Y, Zr, Nb, Ta, W, La, Ce, Pr, Pd, Nd, and mixtures thereof, but is not limited thereto.

In an embodiment of the present invention, when manufacturing the semiconductor device, expansion of the metal may occur due to the heat generated during a later heat treatment or operation of the semiconductor device, or both. As a result, damage to the substrate, and the like, may occur due to protrusion of the metal on the through-hole surface or expansion of the metal filled into the through-hole or both. However, according to an embodiment of the present invention, by forming the protective layer as the porous elastic layer, when the metal expands during the later heat treatment, the thickness of the porous elastic layer is reduced.

Therefore, surface protrusion of the pattern may be suppressed, and the side wall damage that is due to internal expansion reduced. That is, due to the flexibility of the elastic layer, micro stress concentration that is caused by metal expansion does not occur. Accordingly, damage and cracking due to micro stress concentration are prevented, and the leakage current may also be reduced.

Next, the electrical conductor layer 400 is filled into the through-hole with the protective layer 300 formed. The electrical conductor layer 400 may be formed by adsorbing metal on a surface of the protective layer 300 to fill the through-hole of the substrate 100. Here, adsorbing the metal may be performed by using chemical vapor deposition (CVD), physical vapor deposition (PVD), atomic layer deposition (ALD), electroplating, electroless plating, or combinations of deposition methods, but may not be limited thereto. For example, when the metal is deposited through the ALD, by alternatingly adsorbing and substituting molecules on the substrate surface, it is possible to deposit layers having an ultra fine atomic layer thickness, layer by layer, the oxide and electrical conductor layer may be formed to be extremely thin, and the electrical conductor having superb film quality may be filled at a low temperature of at most about 500° C. For example, while the metal is being adsorbed for about 20 minutes, after metal precursor is injected for about 10 seconds, Ar purge is performed for about 20 seconds and iodide is injected for about 5 seconds, and then the Ar purge is performed again for about 20 seconds to thereby fill the metal into the through-hole of the substrate 100, but may not be limited thereto.

According to an exemplary embodiment of the present invention, after filling the electrical conductor into the through-hole of the substrate 100 with the through-hole formed, the heat treatment for enhancing the electrical properties of the metal may be additionally performed, but is not limited thereto.

During the heat treatment, thermal expansion of the metal filled as the electrical conductor occurs, and contraction of the elastic layer 200 may thereby result. The thickness of the elastic layer 200 may include the elastic layer that is thicker, after the heat treatment, than the expanded thickness of the metal, but may not be limited thereto. Thus, during thermal expansion of the metal, even when the elastic layer 200 contracts, the thickness of the elastic layer 200 is thicker than the thickness of the thermally expanded metal, and thus the elastic layer 200 may be present on the substrate 100. Such an elastic layer 200 performs the function of an expansion absorbing film that offsets the shock to the substrate 100 that is due to thermal expansion of the metal, and thus is capable of preventing side wall damage, and the like, which result from protrusion effect of the pattern and internal expansion, during heat treatment. In addition, through a simple process of filling the through-hole by adsorbing the metal on the elastic layer 200, the semiconductor device having a good electromigration performance and a reduced danger of stress-induced voids in copper interconnects may be manufactured.

The present invention provides a semiconductor device including a pattern in which a through-hole is connected by an electrical connection element, the semiconductor device including a silicon substrate in which the through-hole having a protrusion on a side wall thereof is formed, an elastic layer formed by repeatedly forming first and second polymer layers on the side wall of the through-hole, and an electrical conductor provided in the through-hole of the substrate with the elastic layer formed.

According to the present invention, a plurality of micropores are formed on surfaces and inside of the elastic layer, the average diameter of the micropores is about 100 pm to about 100 nm, and the total volume of the micropores formed inside of the elastic layer may be about 20 to about 80 vol % of the elastic layer.

According to an embodiment of the present invention, the elastic layer 200 may be porous, but is not limited thereto. The semiconductor device in which the elasticity of the elastic layer of the through-hole side wall is increased, and which exhibits a low permittivity may be manufactured by using the porous elastic layer 200. Here, the size of the micropores included in the elastic layer 200 may be about 100 pm (picometers) to about 100 nm, and desirably, the size of the micropores included in the elastic layer may be about 100 pm to about 100 nm, about 100 pm to about 50 nm, about 100 pm to about 10 nm, about 100 pm to about 1 nm, about 1 nm to about 100 nm, about 10 nm to about 100 nm, about 30 nm to about 100 nm, about 50 nm to about 100 nm, about 70 nm to about 100 nm, about 90 nm to about 100 nm, about 1 nm to about 90 nm, about 1 nm to about 70 nm, about 1 nm to about 50 nm, about 1 nm to about 30 nm, or about 1 nm to about 10 nm, but is not limited thereto. Due to the micropores included in the elastic layer 200, the elastic layer may exhibit the low permittivity or ultra low permittivity properties.

In an embodiment of the present invention, the total volume of the micropores formed inside of the elastic layer 200 may be about 20 to about 80 vol % of the elastic layer, but is not limited thereto. For example, the total volume of the micropores formed inside of the elastic layer 200 may be about 20 vol % to about 80 vol % of the elastic layer, about 30 vol % to about 80 vol % of the elastic layer, about 40 vol % to about 80 vol % of the elastic layer, about 50 vol % to about 80 vol % of the elastic layer, about 60 vol % to about 80 vol % of the elastic layer, about 70 vol % to about 80 vol % of the elastic layer, about 20 vol % to about 70 vol % of the elastic layer, about 20 vol % to about 60 vol % of the elastic layer, about 20 vol % to about 50 vol % of the elastic layer, about 20 vol % to about 40 vol % of the elastic layer, or about 20 vol % to about 30 vol % of the elastic layer, but is not limited thereto. In an embodiment of the present invention, the greater the volume ratio is of the micropores in the elastic layer 200, the lower may be the dielectric constant of the semiconductor device.

In an exemplary embodiment of the present invention, a protective layer formed on surfaces of micropores included on surfaces of and in the elastic layer may be further included.

In an embodiment of the present invention, after formation of the substrate 100 and elastic layer 200, forming a protective layer 300 for preventing diffusion of metal that may occur in the heat treatment of the electrical conductor layer 400 may be further included, but may not be limited thereto. For example, the protective layer may include a metal thin film, a metal nitride film, or a metal oxide film, and the protective layer may include, for example, Ti, Ta, Ru, W, Zr, Hf, Mo, Nb, V, Cr, Mn, Al, nitride films thereof, or oxide films thereof, but may not be limited thereto.

During the heat treatment, thermal expansion of the metal filled as the electrical conductor occurs, and contraction of the elastic layer 200 may thereby result. The thickness of the elastic layer 200 may include the elastic layer that is thicker, after the heat treatment, than the expanded thickness of the metal, but may not be limited thereto. Thus, during thermal expansion of the metal, even when the elastic layer 200 contracts, the thickness of the elastic layer 200 is thicker than the thickness of the thermally expanded metal, and thus the elastic layer 200 may be present on the substrate 100. Such an elastic layer 200 performs the function of an expansion absorbing film that offsets the shock to the substrate 100 that is due to thermal expansion of the metal, and thus is capable of preventing side wall damage, and the like, which result from protrusion effect of the pattern and internal expansion, during heat treatment. In addition, through a simple process of filling the through-hole by adsorbing the metal on the elastic layer 200, the semiconductor device having a good electromigration performance and a reduced danger of stress-induced voids in copper interconnects may be manufactured.

Hereinafter, the present invention is described in greater detail through Examples. Here, the Examples are provided merely as embodiments of the present invention, and do not limit the scope of the present invention.

EXAMPLES

Example 1

Formation of Semiconductor Device Including Elastic Layer

After cleaning a 500 μm thick silicon wafer substrate with piranha solution in a 100° C. environment for 10 minutes, distilled water was used to further clean the substrate. In order to form a charge on the cleaned substrate, ultraviolet (UV) radiation was emitted for 5 minutes to negatively charge the substrate.

Poly(allylaminehydrochloride) (PAH) aqueous solution with positive charges and poly(sodium 4-styrenesulfonate) (PSS, Aldrich) aqueous solution with negative charges were prepared. The concentrations of the PAH and PSS were prepared as in the below Table 1. The pH of the PAH and PSS aqueous solutions was set to pH 5 and pH 9, respectively.

The heat treated substrate was dipped in each of the PAH aqueous solution and PSS aqueous solution having different concentrations. First, the initial substrate was dipped in the PAH aqueous solution for 10 minutes to perform surface treatment, and then, after dipping in deionized (DI) water for 1 minute, the PAH material remaining on the surface was removed through ultrasonic cleaning. Here, a film of a certain thickness is formed through bonding between the negative charge on the substrate and the positive charge of the PAH, and the residual material remaining on the surface is removed.

Next, the PAH treated substrate was dipped in the PSS aqueous solution for 10 minutes to perform surface treatment, and a polymer film of a certain thickness was formed, due to the different electrolytic properties of the PAH and PSS, to thereby form an elastic layer. Then, residual material was removed through ultrasonic cleaning in DI water for 1 minute. Here, the processes of dipping in PAH, dipping in DI water, dipping in PSS, and dipping in DI water were repeated to control the thickness of the film.

Example 2

Formation of Semiconductor Device Including Elastic Layer

Other than forming the elastic layer by using the conditions as in the below Table 1, the semiconductor device was manufactured according to the same method as the above Example 1.

TABLE 1

| | | Elastic layer | | | | | |
|---|---|---|---|---|---|---|---|
| | Substrate | Type | Concentration | pH | Type | Concentration | pH | No. of times formed |

| | Substrate | Type | Concentration | pH | Type | Concentration | pH | No. of times formed |
|---|---|---|---|---|---|---|---|---|
| Example 1 | Si | PAH | 2 mg/mL | 5 | PSS | 2 mg/mL | 9 | 1 |
| Example 2 | Si | PAH | 2 mg/mL | 5 | PSS | 2 mg/mL | 9 | 3 |
| Example 3 | Si | PAH | 2 mg/mL | 5 | PSS | 2 mg/mL | 9 | 5 |
| Example 4 | Si | PAH | 2 mg/mL | 5 | PSS | 2 mg/mL | 9 | 10 |
| Example 5 | Si | PAH | 2 mg/mL | 5 | PSS | 2 mg/mL | 9 | 20 |
| Example 6 | Si | PAH | 2 mg/mL | 5 | PSS | 2 mg/mL | 9 | 40 |
| Example 7 | Si | PAH | 1 mg/mL | 5 | PSS | 1 mg/mL | 9 | 10 |
| Example 8 | Si | PAH | 4 mg/mL | 5 | PSS | 4 mg/mL | 9 | 10 |

Comparative Example 1

Preparation of Substrate Excluding Elastic Layer

After cleaning a 500 μm thick silicon wafer substrate with piranha solution in a 100° C. environment for 10 minutes, distilled water was used to further clean the substrate, and thereby the substrate provided with a pattern that includes a protrusion in a side wall was prepared.

Experimental Example 1

Examination of Elastic Layer Microstructure

Figure 7:
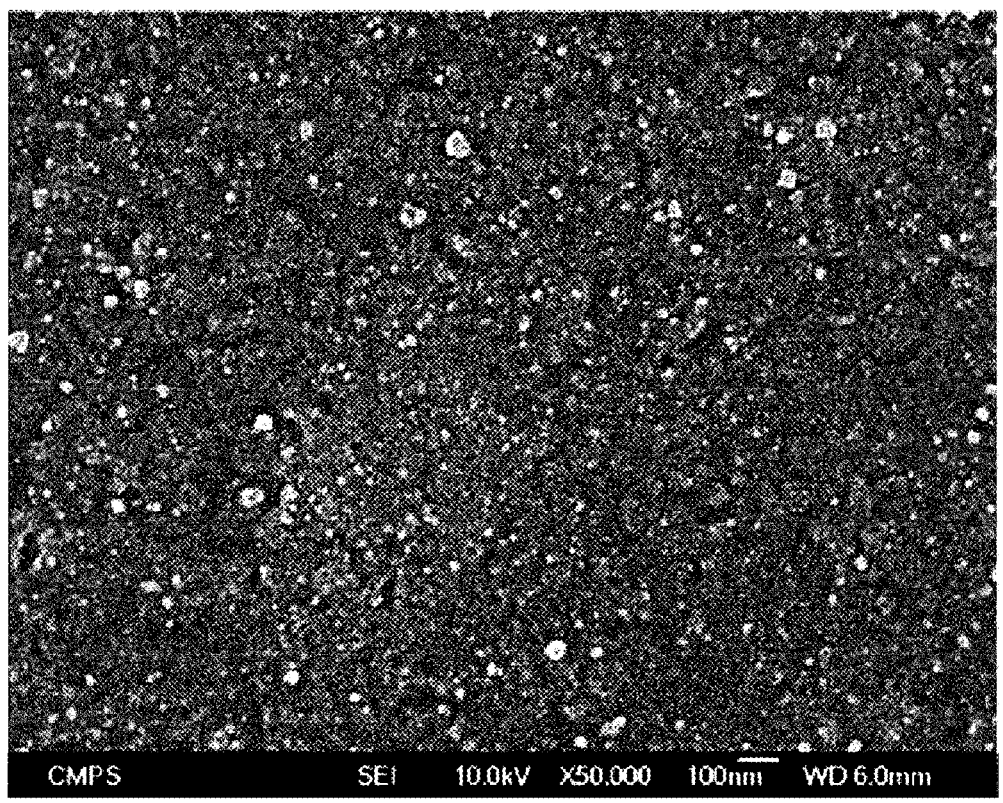
FIG. 7 is a scanning electron microscope (SEM) image of an elastic layer according to an embodiment of the present invention.
Figure 8:
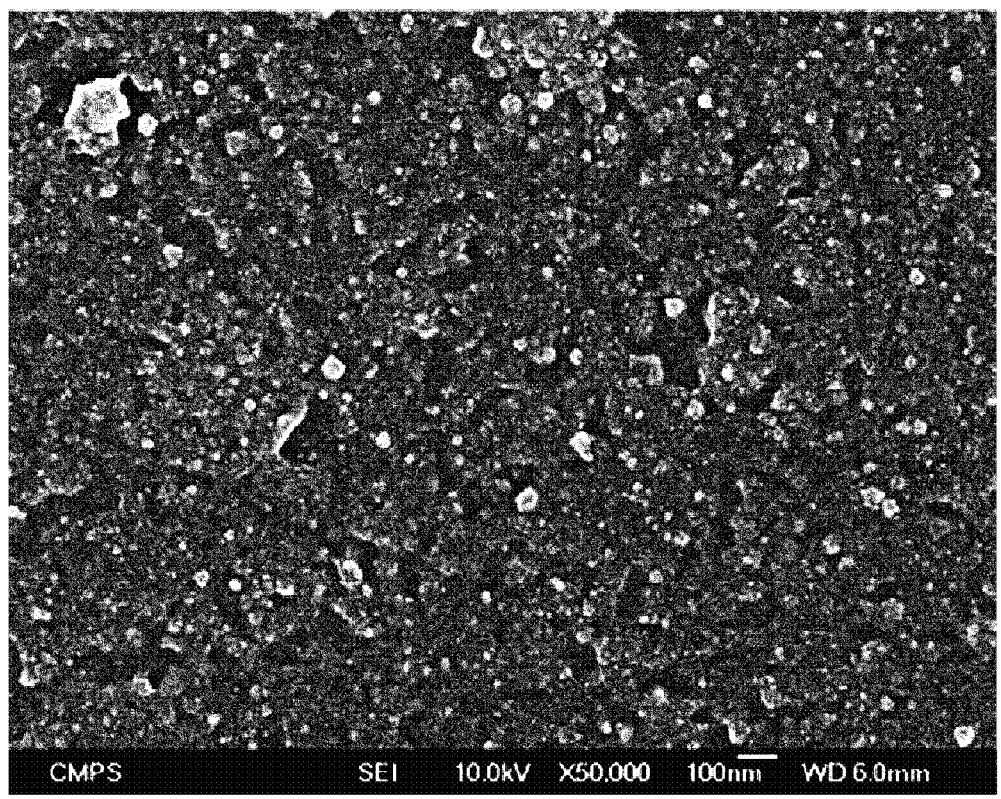
FIG. 8 is a SEM image of an elastic layer according to an embodiment of the present invention.
Figure 9:
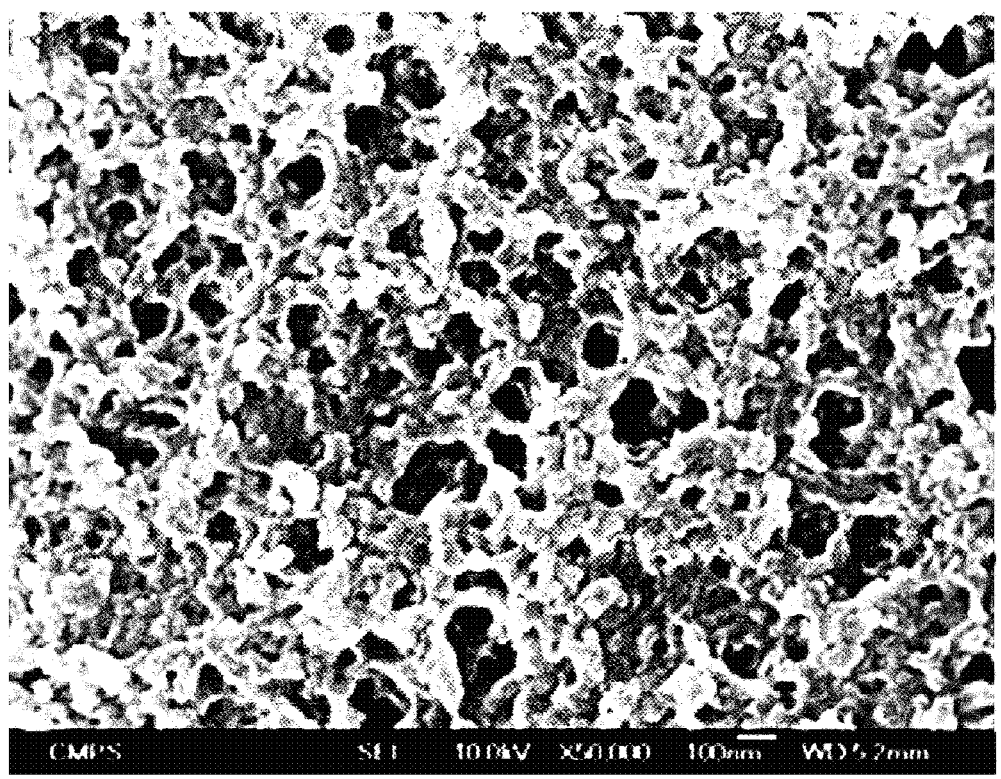
FIG. 9 is a SEM image of an elastic layer according to an embodiment of the present invention.

The surface morphologies of the semiconductor devices that were pretreated with the elastic layers manufactured in Examples 4 and 7 to 8 of the present invention were examined by using a scanning electron microscope (SEM), and the results thereof are shown in FIGS. 7 to 9.

FIG. 7 is a SEM image measuring the surface roughness of the deposited elastic layer when the concentrations of the initial PAH and PSS solutions were each fixed at 1 mg/mL, and, as illustrated in FIG. 7, the elastic layer hardly shows holes on the surface, and it was confirmed that the highly dense elastic layer was deposited. FIG. 8 shows SEM images of when the elastic layer was deposited by fixing the concentrations of the PAH and PSS solutions at 2 mg/mL. As illustrated in FIG. 8, tiny holes were confirmed to have been formed on the surface of the formed elastic layer. FIG. 9 shows SEM images of when the elastic layer was deposited by fixing the concentrations of the PAH and PSS solutions at 4 mg/mL. As illustrated in FIG. 9, large holes were confirmed to have been formed on the surface of the elastic layer, and the inside of the elastic layer was confirmed as being porous. Since, as illustrated in FIG. 9, the elastic layer includes the micropores and flexible layer, and shows a bone-like structure, it was known that mechanical damage is decreased.

Experimental Example 2

Examination of Elastic Layer Microstructure

Figure 11:
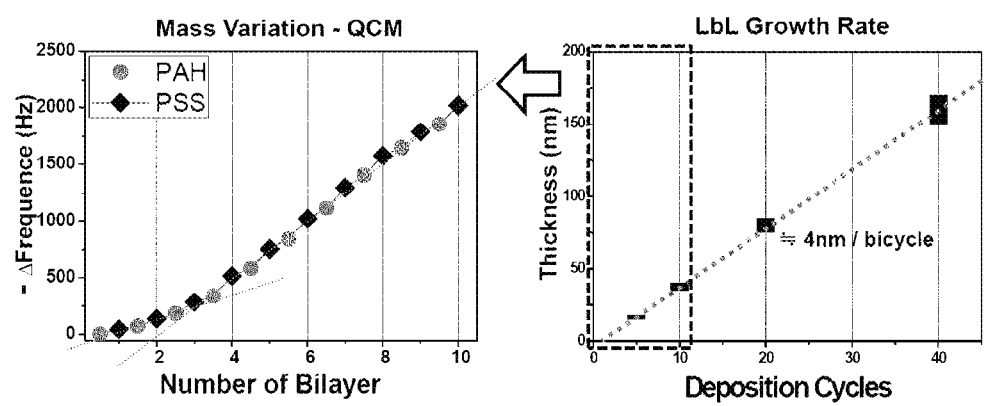
FIG. 11 is a graph showing an increase in thickness and mass of an elastic layer according to number of times the elastic layer was formed according to an embodiment of the present invention.
Figure 12:
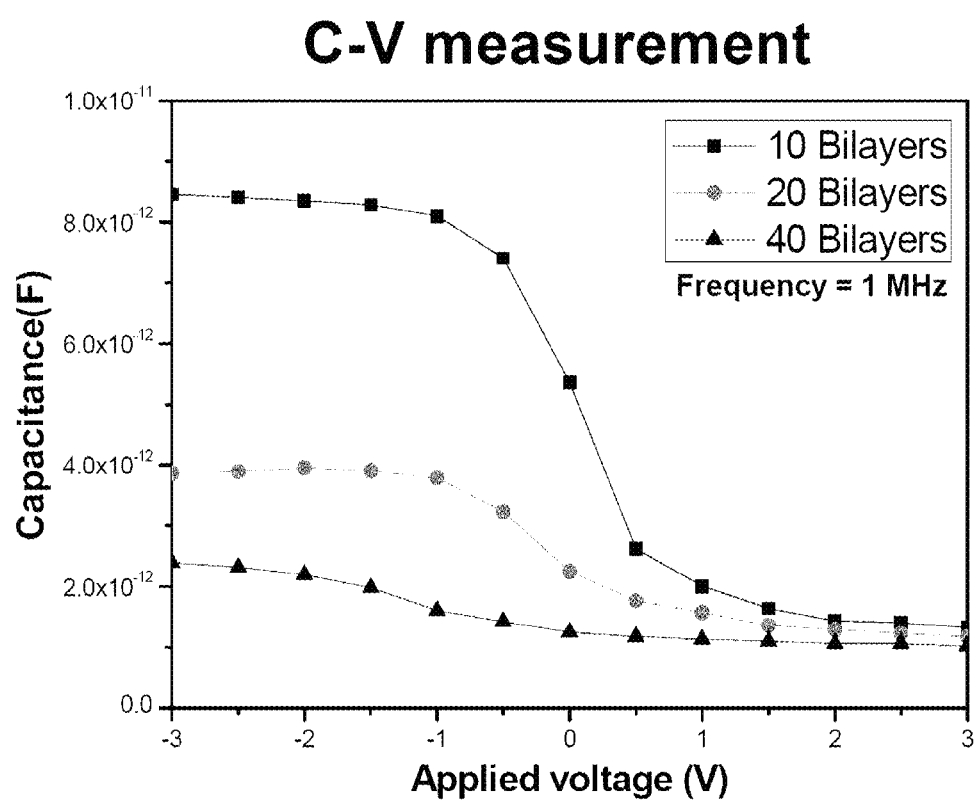
FIG. 12 is a graph showing capacitance-voltage (C-V) measurement results according to number of times the elastic layer was formed according to an embodiment of the present invention.

The weight change, and thickness, roughness, and dielectric constant of the elastic layer, according to number of times formed of the elastic layer formed in Examples 1 to 6 of the present invention was measured and shown in the below Table 2. Here, also, the change in mass of the elastic layer according to the present invention was measured by using a quartz crystal microbalance (QCM), and the thickness and roughness were examined with a scanning electron microscope. The measurement results of the change in the thickness and mass of the elastic layer are shown in FIG. 11. Moreover, the dielectric constant was deduced through capacitance-voltage measurements, and the results thereof shown in the below Table 2 and FIG. 12.

TABLE 2

| | No. of times formed | Thickness (nm) | Change in mass (g) | Roughness (nm) | Capacitance (F) | Dielectric constant |
|---|---|---|---|---|---|---|
| Example 1 | 1 | 1 | 2.20E−06 | 180 | — | — |
| Example 2 | 3 | 5 | 1.29E−05 | — | — | — |
| Example 3 | 5 | 15 | 3.39E−05 | — | — | — |
| Example 4 | 10 | 35 | 9.05E−05 | 160 | 8.45E−12 | 2.77 |
| Example 5 | 20 | 80 | — | 130 | 3.87E−12 | 2.99 |
| Example 6 | 40 | 160 | — | 35 | 1.63E−12 | 2.52 |

Figure 10:
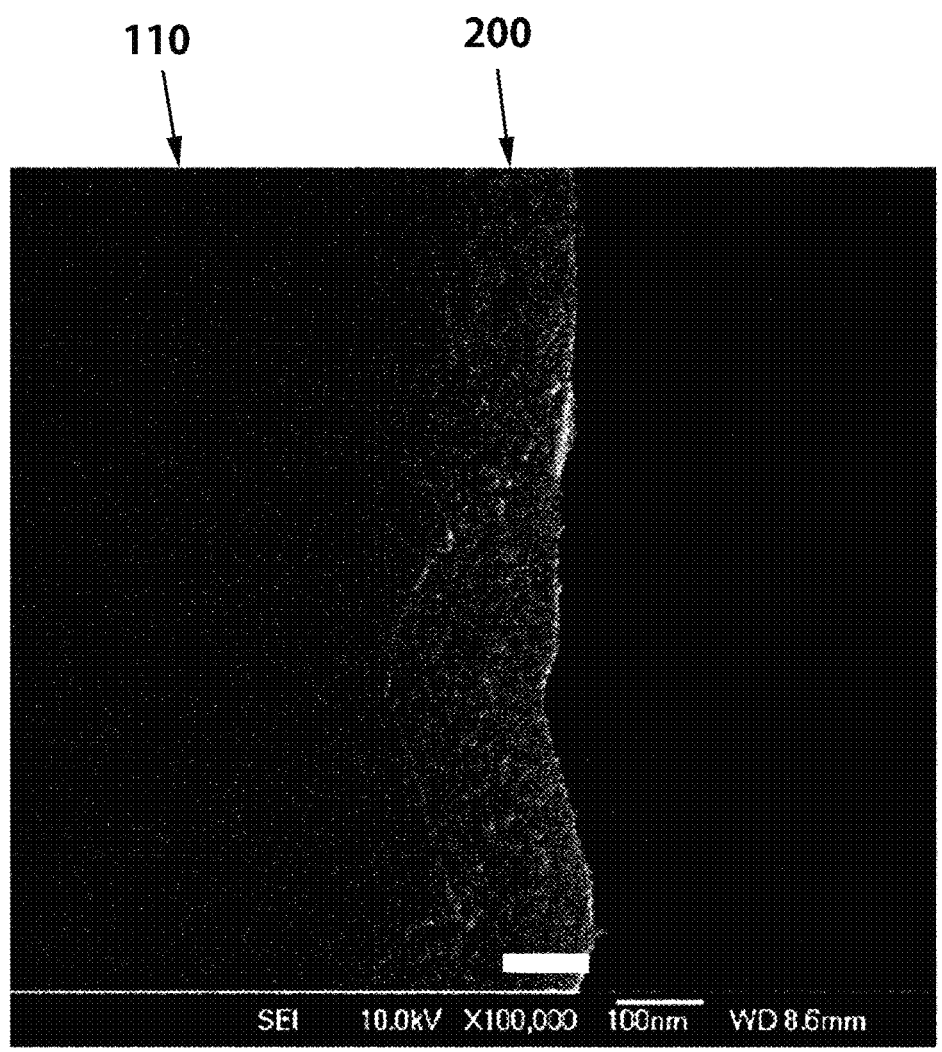
FIG. 10 is a SEM image examining a cross section of an elastic layer according to an embodiment of the present invention.

According to the above Table 2, it was confirmed that the thickness of the elastic layer increases in proportion to the number of times the elastic layer is laminated. Moreover, according to FIG. 10, it was confirmed that the mass of the elastic layer increases in proportion to the number of times the elastic layer is laminated. The roughness of the inner side wall of the through-hole was found to decrease in accordance to the number of times the elastic layer is laminated, as the dent that is formed in the through-hole side wall becomes filled in. Moreover, in the above Examples 4 to 6, the dielectric constant was in the range of about 2.5 to 3, and thus a low average dielectric constant value of about 2.77 was confirmed.

Experimental Example 3

Measurement of Failure Temperature According to Thickness of Elastic Layer

Figure 13:
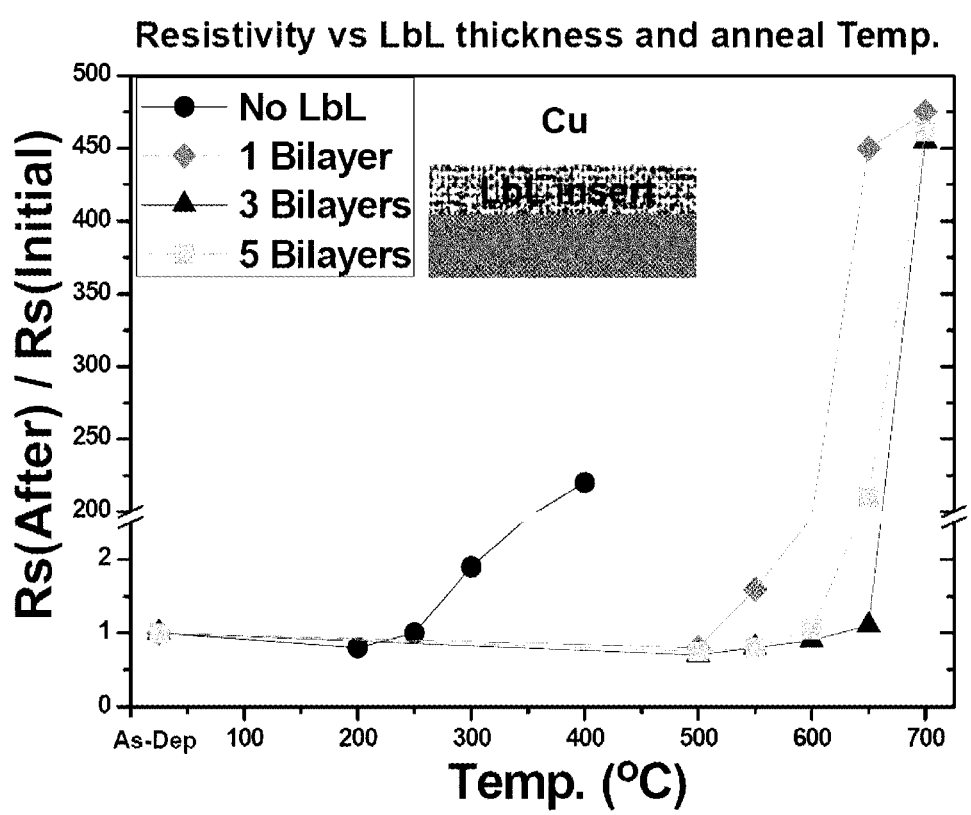
FIG. 13 is a graph of failure temperature measurements according to number of times the elastic layer was formed according to an embodiment of the present invention.

The failure temperature according to thickness of the elastic layer according to the present invention was confirmed through measurement of values of resistance according to heat treatment temperature in Examples 2, 4, and 5 and Comparative Example 1 of the present invention, and results thereof are shown in FIG. 13.

According to FIG. 13, it is confirmed that the failure temperature increases as the number of times the elastic layer is laminated increases. Thus, it was confirmed that the failure temperature increases as the thickness of the elastic layer increases.

Experimental Example 4

Figure 14:
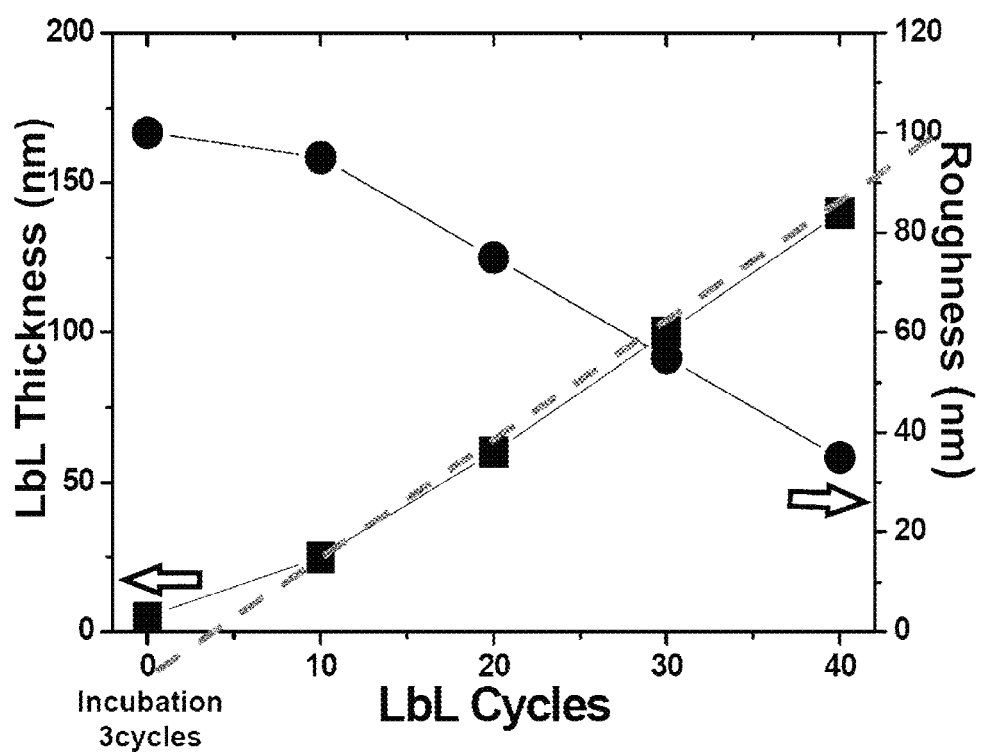
FIG. 14 is a graph of thickness and roughness measurements of an elastic layer according to number of times the elastic layer was formed according to an embodiment of the present invention.

Examination of Thickness and Roughness of Elastic Layer According to Number of Times Formed The increase in elastic layer thickness and resulting change in the roughness of the scallop surface, according to the increase in number of times formed of the elastic layer in Examples 4 to 6 and Comparative Example 1 of the present invention, and results thereof are shown in FIG. 14.

According to FIG. 14, it is confirmed that the thickness of the elastic layer increases proportionally to the number of times formed of the elastic layer, and specifically, it is confirmed that when the number of times formed increases from about 0 up to about 40 times, the thickness of the elastic layer increases from about 0 to about 170 nm. Moreover, the roughness of the protrusion in the pattern structure was confirmed to decrease as the number of times formed of the elastic layer increases, and was confirmed to decrease from about 100 nm down to about 30 nm as the number of times formed increased from about 1 up to about 40 times.

Experimental Example 5

Figure 15:
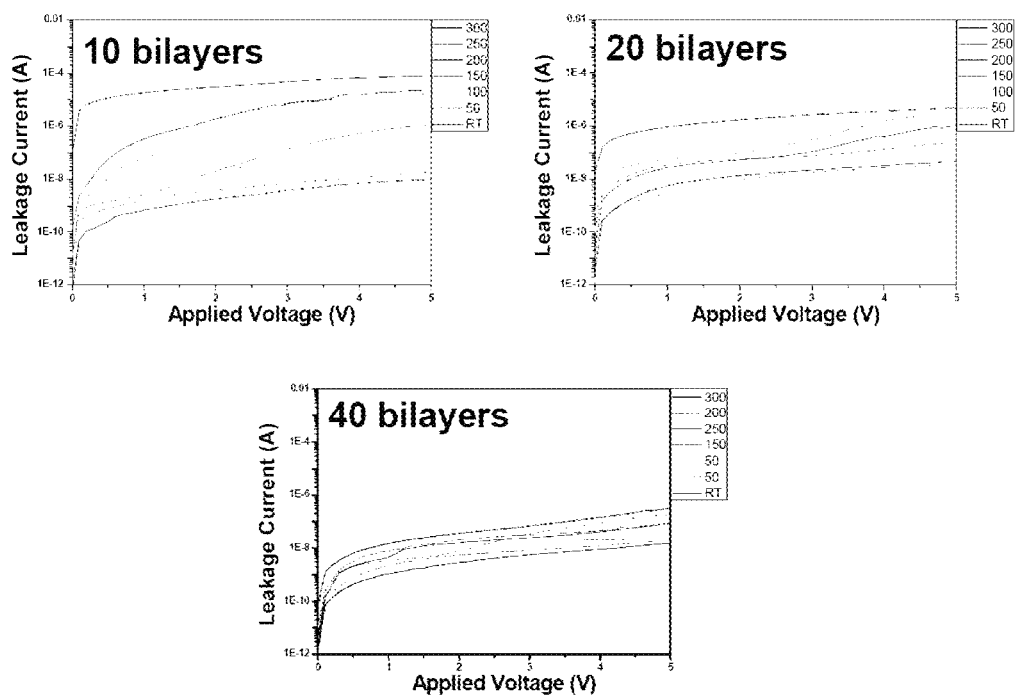
FIG. 15 is a graph of leakage current measurements according to heat treatment temperature and number of times the elastic layer was formed according to an embodiment of the present invention.

Examining Leakage Current According to Number of Times Formed and Heat Treatment Temperature of Elastic Layer The leakage current was measured according to the number of times formed and heat treatment temperature of the elastic layer in the semiconductor device manufactured in Examples 4 to 6 of the present invention, and results thereof are shown in FIG. 15. Moreover, after setting the applied voltage to 5 V, the leakage current according to the heat treatment temperature and the number of times formed of the elastic layer was measured, and results thereof are shown in FIG. 16.

According to FIG. 15, the leakage current was confirmed to decrease as the number of times formed of the elastic layer increases and the temperature of the heat treatment process decreases.

Figure 16:
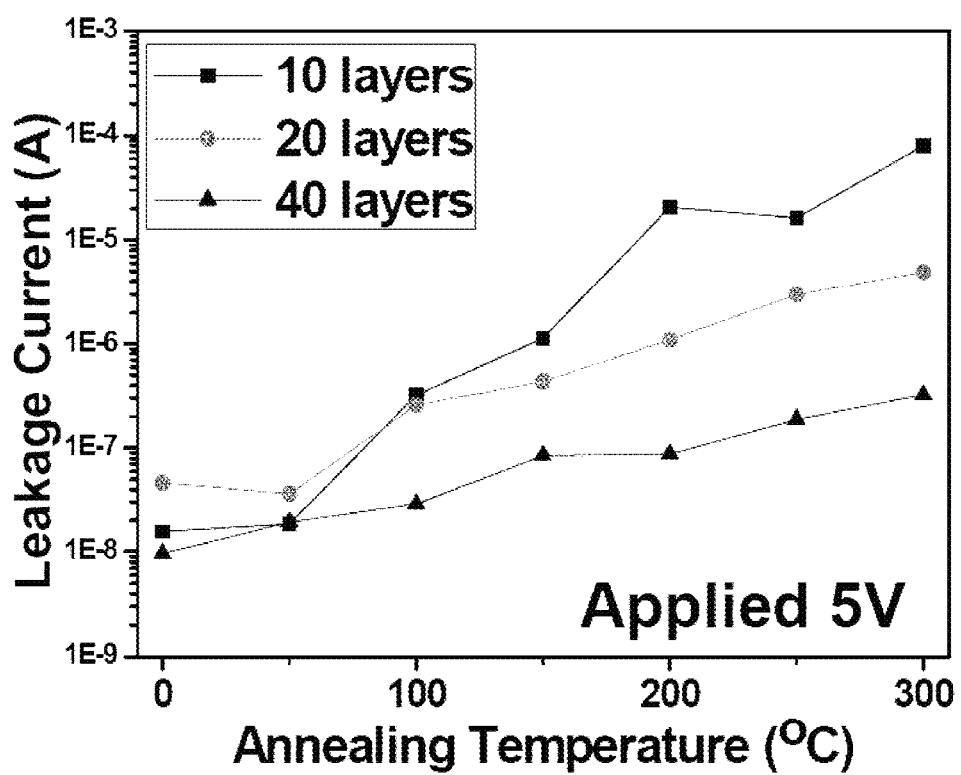
FIG. 16 is a graph of leakage current measurements according to heat treatment temperature and number of times the elastic layer was formed, when 5V of voltage was applied according to an embodiment of the present invention.

According to FIG. 16, when setting the applied voltage to 5 V, it was found that the leakage current increases in proportion with the heat treatment temperature, and decreases in proportion to the number of times formed of the elastic layer.

Manufacturing Example 1

Manufacturing Semiconductor Device

The semiconductor device was manufactured by depositing Cu on the silicon substrate with the elastic layer in the above Example 4 formed.

Manufacturing Example 2

Manufacturing Semiconductor Device Including Protective Layer

By using atomic layer deposition (ALD) at 150° C., TiN layer was deposited as a protective layer on a silicon substrate with the elastic layer of the above Example 4 formed. Next, by using an e-beam evaporator, Cu was deposited on the silicon substrate with the protective layer formed to manufacture the semiconductor device.

Experimental Example 6

Insertion Effect of Protective Layer

After depositing the Cu layer in the above Manufacturing Examples 1 and 2, the vacuum heat treatment time was modified and changes in the surface morphology of the Cu layer was examined using SEM. Specifically, the devices of the above Manufacturing Examples 1 and 2 received heat treatment at 500° C. for 1 hour and 2 hours, and the surfaces before undergoing heat treatment, and the surfaces after undergoing treatment for 1 hour and 2 hours were measured. The results thereof are shown in the following FIG. 17.

Figure 17:
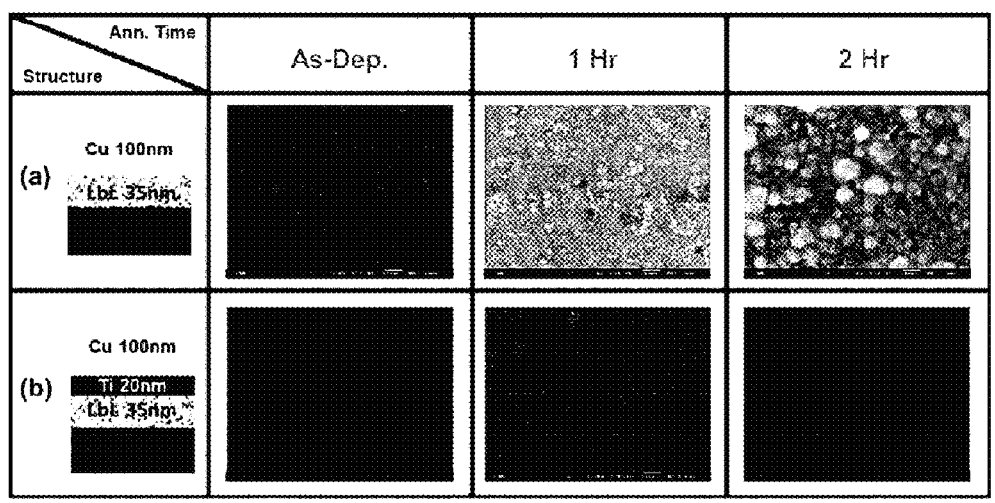
FIG. 17 is a SEM image of surface morphology measurements according to an increase in heat treatment temperature for a structure in which a protective layer (TiN) is inserted according to an embodiment of the present invention.

Here, (a) in FIG. 17A shows a cross-sectional structure of Manufacturing Example 1 (a structure in which an LBL elastic layer 200 and Cu electrical conductor layer 400 are formed on a silicon substrate 100), and (b) in FIG. 17 shows a cross-sectional structure of Manufacturing Example 2 (a structure in which a TiN metal nitride protective layer 300 is inserted between the Cu electrical conductor layer and the LBL elastic layer.

According to FIG. 17, in the structure of (a) and (b), before heat treatment, it was confirmed that the Cu electrical conduction layer 400 has a smooth surface. However, it was confirmed that the roughness of (a) increases and the substrate is exposed as the heat treatment time increases, and in the structure of (b), it was confirmed that the surface experiences almost no deformation and maintains a constant morphology, even when the heat treatment time is increased.

Therefore, in the semiconductor device according to the present invention, it may be deduced that when the protective layer is included after filling the metal into the through-hole during the manufacture of the semiconductor device, the substrate damage that can occur in a later heat treatment process may be prevented.

According to the present invention, an elastic layer including micropores of various sizes and densities may be formed by regulating deposition conditions of the micropore-containing elastic layer, and accordingly, low permittivity properties may be exhibited. Typically, there were limitations such as a metal protrusion effect or side wall damage that could be caused by metal filling the inside of a substrate. By using the micropore-containing elastic layer according to an embodiment of the present invention, contraction, expansion, recovery, and the like may be regulated to overcome limitations such as the metal protrusion effect or side wall damage.

Moreover, the elastic layer according to an embodiment of the present invention includes micropores, and thus may exhibit low permittivity properties. In addition, by regulating the size and density of the micropores included in the elastic layer, the dielectric constant of the elastic layer may be regulated to thereby form a thin film having low permittivity properties.

What is claimed is:

1. A method of forming a through-hole in a silicon substrate, the method comprising:
    forming the through-hole in the substrate;
    pretreating a side wall of the through-hole such that the side wall is electrically charged;
    forming a first polymer layer by coating the pretreated side wall with a polymer having charges opposite to those of the substrate; and
    forming a second polymer layer by coating the first polymer layer with a polymer having the same charges as the substrate,
    wherein the forming of the first polymer layer and the forming of the second polymer layer are repeatedly performed to form an elastic layer in which a plurality of the first polymer layer and second polymer layer are laminated;
    wherein a plurality of micropores are formed on surfaces and inside of the elastic layer;
    an average diameter of the micropores ranges from about 100 pm to about 100 nm;
    a total volume of the micropores formed inside of the elastic layer ranges from about 20 to about 80 volume % of the elastic layer;
    wherein the first polymer layer and the second polymer layer are respectively formed through a layer-by-layer (LBL) assembly of a cationic polymer and an anionic polymer;
    wherein the cationic polymer or anionic polymer further include an inorganic material and a low permittivity property of the elastic layer can be controlled by using a porous inorganic material by mixing with the cationic polymer or anionic polymer;
    wherein the concentration of the cationic polymer ranges from about 0.1 to about 5 mM, and the concentration of the anionic polymer ranges from about 0.1 to about 5 mM; and
    wherein a pH of the cationic polymer ranges from about 1 to about 8, and a pH of the anionic polymer ranges from about 8 to about 14.

2. The method of claim 1, wherein the side wall of the through-hole is pretreated by using one kind of method selected from the group consisting of ultraviolet (UV) emission, plasma treatment, catalyst treatment, and self-assembled monolayer treatment.

3. The method of claim 1, wherein the cationic polymer includes one or more selected from the group consisting of poly(allylaminehydrochloride) (PAH), poly(ethyleneimine) (PEI), poly(diallyldimethylammoniumchloride) (PDAC), poly(4-vinylbenzyltrimethylammoniumchloride) (PVTAC), and derivatives thereof.

4. The method of claim 1, wherein the anionic polymer includes one or more selected from the group consisting of poly(styrenesulfonate) (PSS), poly(acrylicacid) (PAA), poly(vinylsulfonicacid) (PVS), sulfonated polystyrene (SPS), and derivatives thereof.

5. The method of claim 3, wherein the cationic polymer is poly(allylaminehydrochloride) or a derivative thereof.

6. The method of claim 4, wherein the anionic polymer is poly(sodium 4-styrenesulfonate) or a derivative thereof.

7. The method of claim 1, wherein the cationic polymer or the anionic polymer further includes an inorganic material,
    the inorganic material being one or more selected from the group consisting of a nanotube, a nanowire, a colloid, a particle, a thin film, and combinations thereof.

8. The method of claim 1, wherein the thickness of the elastic layer is about 0.1% to about 10% of the diameter of the through-hole.

9. The method of claim 1, further comprising, after the forming of the elastic layer, etching the unnecessary elastic layer included in the upper and lower portions of the through-hole by using an anisotropic etching process,
    wherein the anisotropic etching process may be performed by using at least one selected from the group consisting of ion etching, reactive ion etching, ashing, inductively coupled plasma etching, and wet etching.

10. The method of claim 1, wherein the step coverage of the elastic layer is at least about 90%.

11. A method of forming an electrical connection element which penetrates through a silicon substrate and is electrically connected, the method comprising:
    forming a through-hole in the substrate;
    pretreating a side wall of the through-hole such that the side wall is electrically charged;
    forming a first polymer layer by coating the pretreated side wall with a polymer having charge opposite to those of the substrate;
    forming a second polymer layer by coating the first polymer layer with a polymer having the same charges as the substrate;
    forming an elastic layer by repeatedly performing the forming of the first polymer layer and the forming of the second polymer layer formed through a layer-by-layer (LBL) assembly of a cationic polymer and an anionic polymer;
    wherein a plurality of micropores are formed on surfaces and inside of the elastic layer;
    an average diameter of the micropores ranges from about 100 pm to about 100 nm;
    a total volume of the micropores formed inside of the elastic layer ranges from about 20 to about 80 volume % of the elastic layer;
    wherein the cationic polymer or anionic polymer further include an inorganic material and a low permittivity property of the elastic layer can be controlled by using a porous inorganic material by mixing with the cationic polymer or anionic polymer;
    wherein a concentration of the cationic polymer ranges from about 0.1 to about 20 mM, and a concentration of the anionic polymer ranges from about 0.1 to about 20 mM;
    wherein a pH of the cationic polymer ranges from about 1 to about 8, and a pH of the anionic polymer ranges from about 8 to about 14; and
    forming the electrical connection element by filling an electrical conductor into the through-hole of the substrate with the elastic layer formed.

12. The method of claim 11, wherein the electrical conductor includes at least one metal selected from the group consisting of Cu, Al, Li, Ni, Co, Fe, Cr, Zn, B, Ag, Ge, Sn, In, V, Ti, Y, Zr, Nb, Ta, W, La, Ce, Pr, Pd, Nd, and mixtures thereof.

13. The method of claim 11, further comprising after forming of the elastic layer and before the filling of the electrical conductor, forming a protective layer on surfaces of the micropores included on the surfaces and inside of the elastic layer, wherein the protective layer is formed through one process selected from the group consisting of electroplating, electroless plating, chemical vapor deposition, atomic layer deposition, and chemical bath deposition.

14. A semiconductor device including a pattern in which a through-hole is connected by an electrical connection element, the semiconductor device comprising:

a silicon substrate in which the through-hole having a protrusion on a side wall thereof is formed;

an elastic layer formed by repeatedly forming first and second polymer layers on the side wall of the through-hole formed through a layer-by-layer (LBL) assembly of a cationic polymer and an anionic polymer;

wherein a plurality of micropores are formed on surfaces and inside of the elastic layer;

an average diameter of the micropores ranges from about 100 pm to about 100 nm;

a total volume of the micropores formed inside of the elastic layer ranges from about 20 to about 80 volume % of the elastic layer;

wherein the cationic polymer or anionic polymer further include an inorganic material and a low permittivity property of the elastic layer can be controlled by using a porous inorganic material by mixing with the cationic polymer or anionic polymer;

wherein a concentration of the cationic polymer ranges from about 0.1 to about 20 mM, and a concentration of the anionic polymer ranges from about 0.1 to about 20 mM; and wherein a pH of the cationic polymer ranges from about 1 to about 8, and a pH of the anionic polymer ranges from about 8 to about 14; and an electrical conductor provided in the through-hole of the substrate with the elastic layer formed.

15. The semiconductor device of claim 14, further comprising a protective layer formed on surfaces of the micropores included on the surfaces and inside of the elastic layer.

* * * * *